(12) United States Patent
Lin et al.

(10) Patent No.: US 8,994,469 B2
(45) Date of Patent: Mar. 31, 2015

(54) SUPPRESSION OF FAR-END CROSSTALK AND TIMING JITTER BY USING RECTANGULAR RESONATORS

(71) Applicant: National Taipei University of Technology, Taipei (TW)

(72) Inventors: Ding-Bing Lin, Taipei (TW); Chen-Kuang Wang, Taipei (TW)

(73) Assignee: National Taipei University of Technology, Taipei (TW)

( * ) Notice: Subject to any disclaimer, the term of this patent is extended or adjusted under 35 U.S.C. 154(b) by 225 days.

(21) Appl. No.: 13/625,580

(22) Filed: Sep. 24, 2012

(65) Prior Publication Data

US 2013/0127559 A1 May 23, 2013

(30) Foreign Application Priority Data

Sep. 23, 2011 (TW) .............................. 100134489 A (51) Int. Cl.
*H05K 1/02* (2006.01)
*H04B 3/32* (2006.01)

(52) U.S. Cl.
CPC ................ *H04B 3/32* (2013.01); *H05K 1/0219* (2013.01); *H05K 1/0233* (2013.01)
USPC .............................................. 333/1; 333/246

(58) Field of Classification Search
CPC . H05K 1/0216; H05K 1/0218; H05K 1/0219; H05K 1/0224; H05K 1/0228; H05K 1/0233
USPC ....................................................... 333/1, 246
See application file for complete search history.

(56) References Cited

U.S. PATENT DOCUMENTS 7,659,791 B2 * 2/2010 Park et al. ......................... 333/1

\* cited by examiner

*Primary Examiner* — Benny Lee
(74) *Attorney, Agent, or Firm* — Muncy, Geissler, Olds & Lowe, P.C.

(57) ABSTRACT

Rectangular-shape resonators as guard traces formed in a region between the victim and aggressor lines are disclosed. No shorting-vias or resistors are required. The rectangular resonators are found to have functions of improving far-end crosstalk (FEXT) and timing jitter in both frequency domain and time domain if the parameters are appropriated selected.

8 Claims, 8 Drawing Sheets

SUPPRESSION OF FAR-END CROSSTALK AND TIMING JITTER BY USING RECTANGULAR RESONATORS

FIELD OF THE INVENTION

The present invention pertains to an architecture for suppressing the far-end crosstalk and the signal timing jitter, particularly to the architecture where rectangular resonators a formed in between two signal transmission lines to improve problems of far-end crosstalk (FEXT) and signal timing jitter.

DESCRIPTION OF THE PRIOR ART

To attract consumers, the trend of electronic products toward light, slim, short, small, with functional diversification, and processing in high speed become a tendency, it means that not only each integrated circuit is with high-integrity, but the traces layout on the print circuit board are dense and the spacing between adjacent lines are getting smaller and smaller. On the other hand, the processor in the electronic products is usually being operated in high frequency as a result, the wavelength is less than the length of the signal transmission lines.

In other words, the signal traces themselves and in between thereof will present a large number of parasitic capacitive coupling and the inductive coupling therein, which make mutual interference and generate noises. Consequently, crosstalk interferences are resulted.

To solve crosstalk interference, conventional art provides 3-W rule. Some research found that the line spacing widened up to 3 times the microstrip line width, near-end crosstalk (NEXT) can be reduced to 1%, far-end crosstalk (FEXT) interference reduced to 1.4%, and effective isolating the amount of coupling between the two transmission lines by 70%. In addition, if 98% of the amount of coupling isolation is requested, then it will demand a 10-W rule. Whereas 3-W rule will reduce significantly the trace density, not to mention the 10-W rule, which will further lower the trace density.

Figure 1:
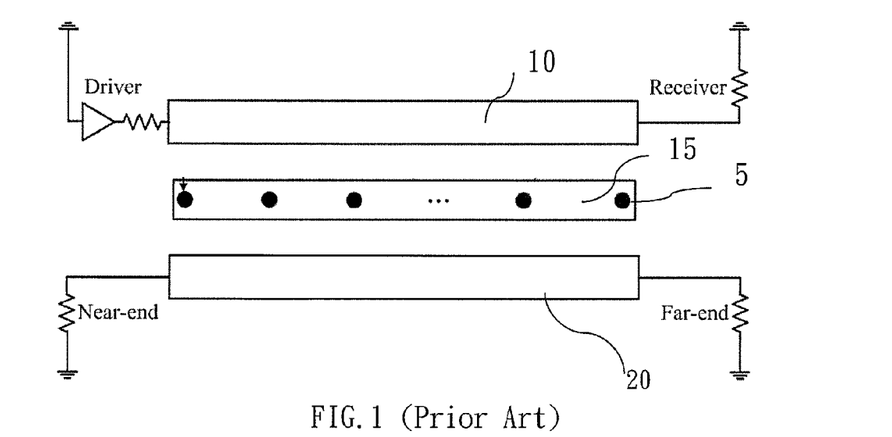
FIG. 1 shows a schematic diagram according to an embodiment of a prior art, which has shorting-vias as guard traces formed in between two signal transmission lines.

According to another conventional embodiment, as shown in FIG. 1, guard traces are added in between the two signal transmission lines 10, 20. The signal transmission line 10 has one end connected to a driver and the other end connected to a receiver. The guard traces 15 are open terminations. The energy of the aggressive line 10 is also coupled to the guard traces 15 generating ringing noise at the near end and far end of the interference (victim) line 20. The ringing noise generation is mainly because the ratio of the capacitive coupling between the signal lines 10, 20 and guard traces 15 are less than the inductive coupling ratio. According to the embodiment, shorting-vias 5, hereinafter called shorting-vias, are formed to the guard traces 15 forming grounded guard traces so as to suppress the noise, as shown in FIG. 1. Hereinafter the capacitive coupling ratio refers to a ratio of mutual capacitance over self-capacitance: $C_m/C_T$, and inductive coupling ratio refers to the ratio of the mutual inductance over self-inductance: $L_m/L_s$.

Figure 2:
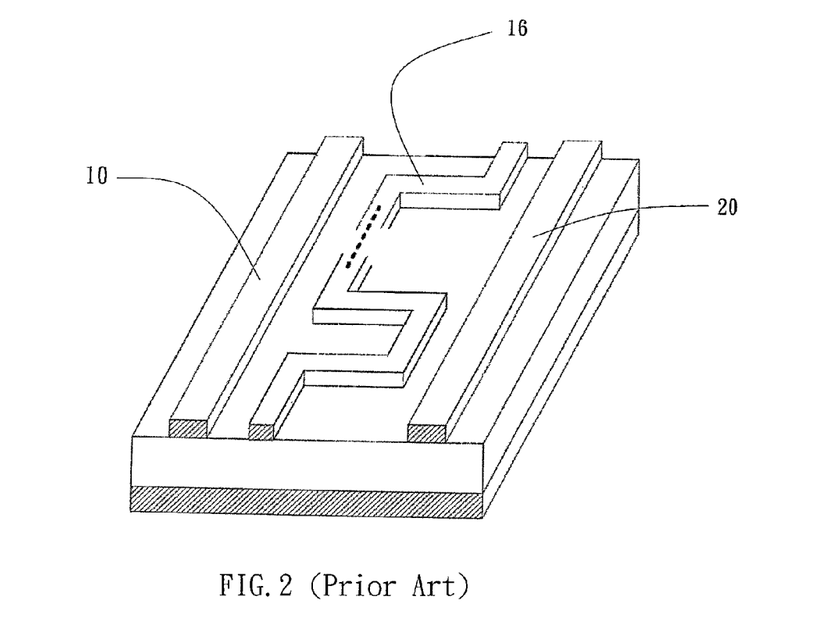
FIG. 2 shows a schematic diagram according to another embodiment of a prior art, which has meandering guard traces formed in between two signal transmission lines.

Still another known guard traces called serpentine guard traces 16, as shown in FIG. 2. The serpentine guard traces 16 are formed in between the aggressor line 10 and the victim line 20. The components of the guard traces 16 perpendicular to the signal lines will not have the magnetic field coupling, and the parallel component thereof will increase the capacitive coupling and the inductive coupling. This serpentine protective line 16 is found to be effective to reduce the FEXT and signal timing jitter, but it will increase the NEXT. Another disadvantage is that the serpentine guard traces 16 are demanded to install the resistors, please refer to "A Serpentine Guard Trace to Reduce the Far-End Crosstalk Voltage and the Crosstalk Induced Timing Jitter of Parallel" IEEE TRANSACTIONS ON ADVANCED PACKAGING, pp 809-817, VOL. 31, NO. 4, 2008. Accordingly, it is proposed to replace the resistors by shorting-vias. However, excessive shorting-vias will affect the flexibility of the circuit layout on the back plane of the printed circuit board. By contrast, if the number of the shorting-vias is not enough, the spacing between short-vias is found to have half-wavelength resonance problem in the frequency domain and have the ringing noise problem in the time domain.

To overcome the problem of insufficient shorting-vias, a conventional embodiment proposes forming shorting-vias at the two terminals of the guard traces, and additional dielectric material is covered on the printed circuit board so as to compensate the capacitive coupling ratio between the signal line and guard traces. This technology is known as "disposed with a cover plate". It can eliminate FEXT interference due to guard traces. The disadvantages are that this technology will increase the material cost. On the other hand, in the situation of the printed circuit board has dense elements already, it is difficult to add other materials thereover.

In view of the above problems found in the conventional techniques, which indeed improve problems on the crosstalk but the disadvantage including either additional costs or limitations or both during the technique implement. The present invention will provide a new technology, and effective in improving the above problems.

SUMMARY OF THE PRESENT INVENTION

An object of the present invention is to provide architecture to suppress the FEXT during signal transmission and the signal timing jitter.

Another object of the present invention is to provide rectangular resonators in between the signal transmission lines to suppress the FEXT without extra cost.

The present discloses guard traces for preventing two parallel transmission lines from far-end crosstalk (FEXT) and timing jitter, comprises forming a plurality of rectangular resonators in between the two parallel signal transmission lines and having long sides thereof perpendicular to a transmission direction.

The architecture of rectangular resonators does not need any extra resistors and shorting-vias, but only requires choosing appropriate parameters including the length and the width of the rectangular resonator and the interval in between the rectangular resonators and the spacing of the rectangular resonators to the aggressive line and victim line.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 10 (a) and 10 (b) show eye diagrams by simulation in conditions of with and without rectangular resonators, respectively.

FIGS. 11 (a) and 11 (b) show eye diagrams by simulation in conditions of with and without rectangular resonates, respectively in accordance with another simulating conditions.

DETAILED DESCRIPTION OF THE PREFERRED EMBODIMENT

Figure 3:
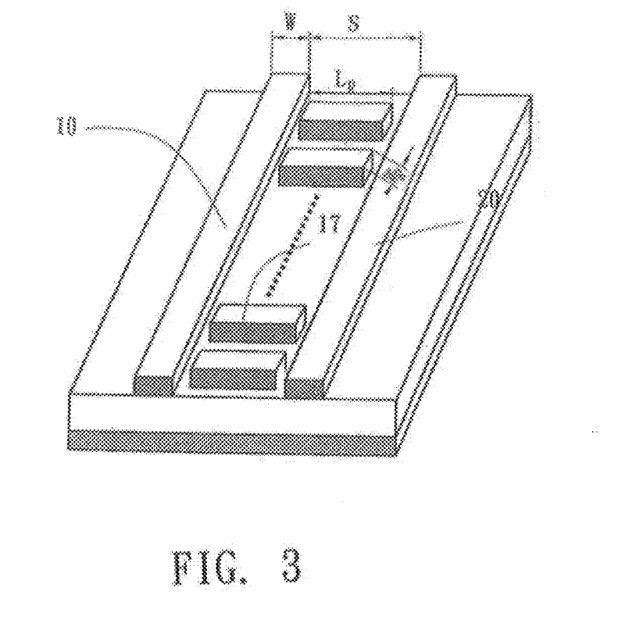
FIG. 3 shows a schematic diagram according to an embodiment of the present invention, which has a plurality of rectangular resonators as guard traces formed in between two signal transmission lines.

The present invention provides an architecture of rectangular resonators to solve the problem of crosstalk among signal transmission lines. The crosstalk elimination is implemented almost at no extra cost. It is because the two signal transmission lines, the aggressive line 10 and the victim line 20, and the rectangular resonators 17 in between, as shown in FIG. 3, are formed simultaneously during the trace etching process. It does not require any resistor installation or form any shorting-via.

Figure 4:
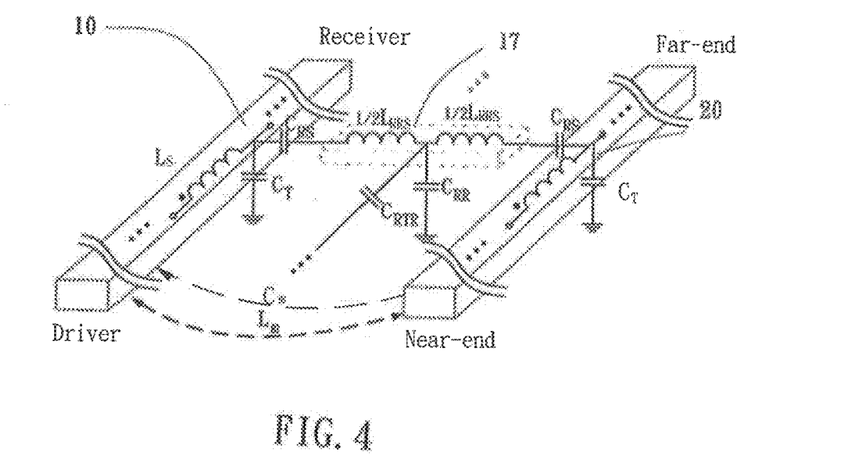
FIG. 4 shows mutual capacitance, mutual inductance between the two signal transmission lines, and a self-capacitance and self-inductance in an equivalent circuit while two signal transmission lines has a rectangular resonator formed in between as guard traces according to an embodiment of the present invention.

To analyze how a far end crosstalk (FEXT) interference and near-end crosstalk (NEXT) are suppressed by rectangular resonators. An equivalent circuit of rectangular resonators and coupling traces is shown in FIG. 4, where $C_T$ is a self-capacitance of the aggressor line 10 and the victim lines 20; $C_m$ is a mutual capacitance between the aggressors line 10 and the victim line 20; $L_S$ is a self-inductance of the aggressor line 10 and the victim lines 20, $L_m$ is a mutual inductance between the aggressors line 10 and the victim line 20; $L_R$ is the length of the rectangular resonator 17, as shown in FIG. 3; $\frac{1}{2} L_{RRS}$ an equivalent self-inductance due to a half length of the rectangular resonator 17; $C_{RS}$ is a capacitance due to parallel plates formed by rectangular resonator and the signal line; $C_{RR}$ is a parallel plate capacitance generated due to parallel plates formed by rectangular resonator 17 and the reference plane; $C_{RTR}$ is a parallel plate capacitance generated due to parallel plates formed by a rectangular resonator 17 and its adjacent rectangular resonator 17.

Figure 5:
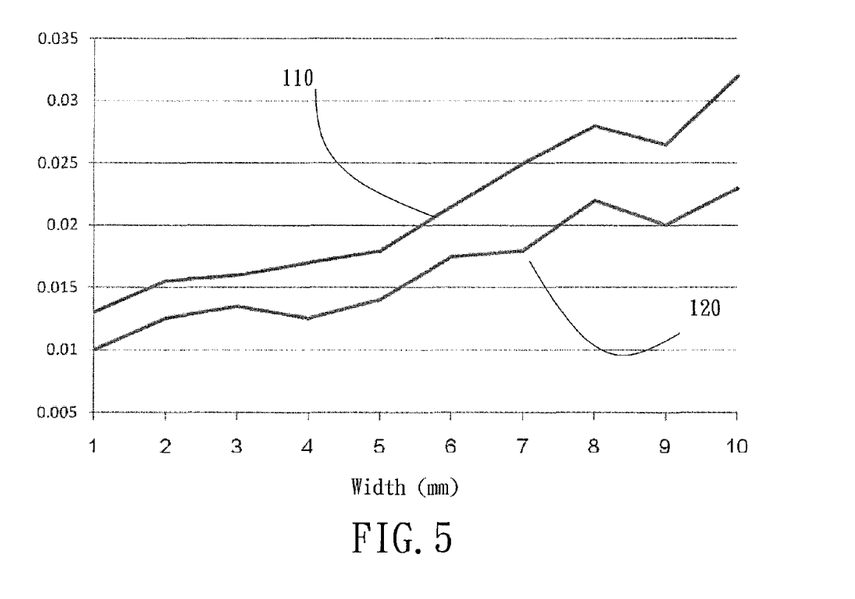
FIG. 5 is a schematic diagram showing changes in the various width of the rectangular resonator with the inductive coupling and the capacitive coupling.

Therefore, as is seen from the equivalent circuit shown in FIG. 4, the capacitance $C_{RS}$ will be increased with the width $W_R$ of the rectangular resonator 17. Similarly, the capacitance $C_{RS}$ will be increased with the length $L_R$ of the rectangular resonator 17, as shown in FIG. 3. That is the closer rectangular resonator 17 is to the aggressor line 10 and victim line 20, the larger of the $C_{RS}$ will be. However, the wider the width $W_R$ of the rectangular resonator 17 also increases the inductive coupling ratio between the rectangular resonator 17 and the two signal transmission lines. FIG. 5 shows such a result.

Figure 6:
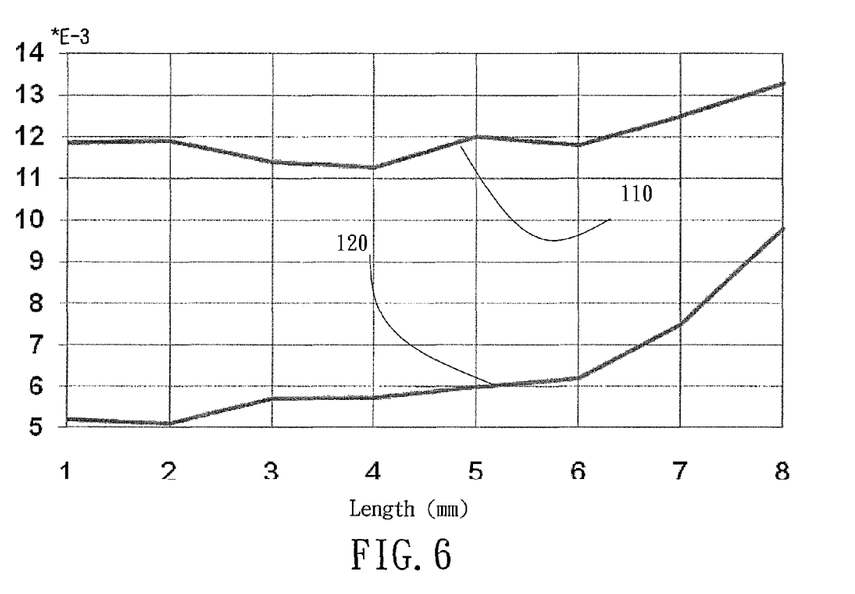
FIG. 6 is a schematic diagram showing changes in the various length of the rectangular resonator with the inductive coupling and the capacitive coupling.
Figure 7:
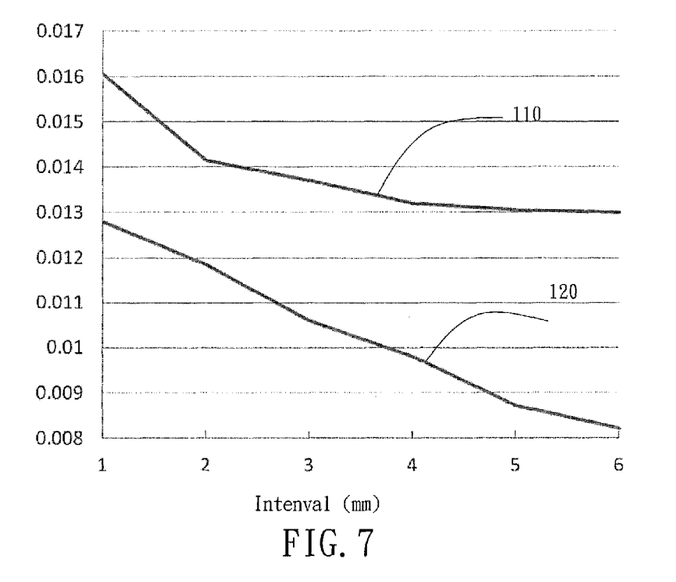
FIG. 7 is a schematic diagram showing various interval changes among the rectangular resonators with the inductive coupling and the capacitive coupling.

To judge whether the rectangular-resonators 17 are capable of improving the problem of crosstalk and signal timing jitter, the following analyses are done. In FIGS. 5 to 7, the analyses are base on the following parameters: a ratio of the space S (FIG. 3) between two signal transmission lines over the width w (FIG. 3) of the signal transmission line is by 3:1. For example, two signal transmission lines are spaced by 9 mm and each has a width 3 mm; the dielectric material of the substrate is FR4, has a relative dielectric constant 4.4, and the dielectric substrate has a thickness of 1.6 mm, and the foil thickness is 0.035 mm. In practice, the rectangular resonators 17 can also be used in the situation of S=2W in accordance with the present invention.

FIG. 5 is a schematic diagram showing changes in the various width in mm of the rectangular resonator with the mutual inductive coupling and the mutual capacitive coupling. The curve 110 depicts that inductive coupling ratio ($L_m/L_s$) is increase with the width of rectangular resonator 17. The curve 120 depicts that capacitive coupling ratio ($C_m/C_T$) is increase with the width of rectangular resonator 17 in a similar tendency as the curve 110. Whereas, the increase in the inductive coupling ratio is dramatically increased with the width of the rectangular resonator 17 far in excess than that of the capacitive coupling ratio. Therefore, according to the changes of two curves 110, 120, in the FIG. 5, the width $W_R$ of the rectangular resonator 17 becoming too large is not appropriate. An example of $W_R$ in mm may be 0.5 mm to 1.5 mm. preferably $W_R$=1 mm. Within these ranges, an approaching degree between the Inductive coupled ratio and the capacitive coupling ratio, though is not as that of $W_R$ at 3 mm, but when the width $W_R$ in mm is above 1.5 mm, the inductive coupling ratio will be increase dramatically.

Referring to FIG. 6, it is a schematic diagram showing changes in the various length in mm of the rectangular resonator with the mutual inductive coupling and the mutual capacitive coupling. The curve 120 depicts that the capacitive coupling ratio ($C_m/C_T$) increased with the length of the rectangular resonator 17. It is expectable, because the closer the short side of the rectangular resonator 17 to the signal transmission lines 10, 20, mutual capacitance $C_m$ will increase rapidly. The curve 110 shows that the inductive coupling ratio has the same trend of increasing. But apparently the increasing rate of mutual inductance $L_m$ with the length of rectangular resonator 17 is less than that of the mutual capacitance $C_m$. Therefore, viewing from the trend of capacitive coupling and inductive coupling, the length of the rectangular resonator 17 increasing is in favor of the proximity of the inductive coupling ratio with the capacitive coupling ratio. Accordingly, choosing 8 mm as a length of the rectangular resonator 17 is appropriate in accordance with a preferred embodiment.

Referring to FIG. 7, it is a schematic diagram showing interval changes between the rectangular resonators versus the mutual inductive coupling and the mutual capacitive coupling. Surely, the reduction of the interval will increase the number of rectangular resonators. The curve 120 shows that the capacitive coupling ratio ($C_m/C_T$) is increasing with the reducing of the interval. The curve 110 also shows that the inductive coupling ratio is increasing with the reducing of the interval. Particularly, as the interval goes down to about 2 mm or less, the inductive coupling ratio substantial increases. This is very obvious, excessive number of rectangular resonator 17, the current path will increase. View from FIG. 7, it seems that the capacitive coupling ratio is in the closest proximity to the inductive coupling ratio as the interval is of 2 mm. But in summary the results of FIG. 5 to FIG. 7, an optimum of the interval is in between about 3.5 to 4.5 mm. FIG. 6 shows that the capacitive coupling ratio is of about 0.0098, while the inductive coupling ratio of about 0.0132 as the length rectangular resonator 17 is of 8 mm. Therefore, the benefit obtained from the interval of 2 mm are not enough to compensate for the disadvantage found in FIG. 6. The interval which becomes too small produces inferior results Therefore, the result of a compromise, the interval should be chosen at a value between about 3.5 to 4.5 mm and 4 mm is the most preferred. That is, a preferred interval is of about ⅓ to ½ of the long side of the rectangular resonator.

Based on the aforementioned analysis, the design parameters of the preferred rectangular resonators 17 are: 1×8 mm² each and the number of rectangular resonators is of 16, assuming the aggressors line and the victim line have a length of 70 mm.

Figure 8:
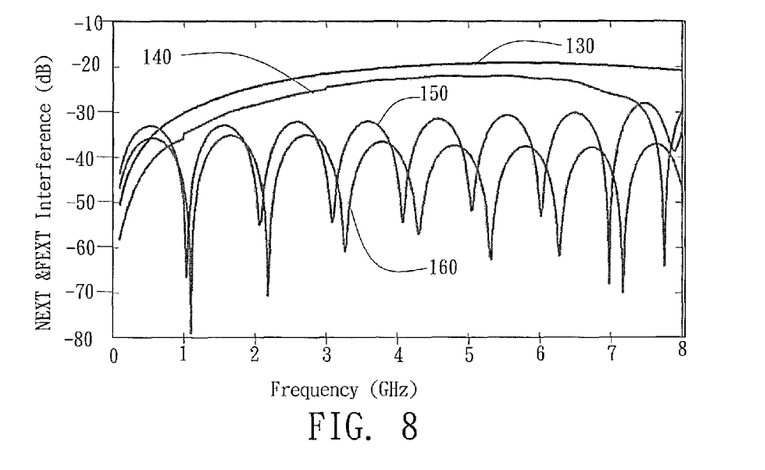
FIG. 8 shows the comparison results between the NEXT and FEXT in the frequency-domain by simulation in accordance with preferred design parameters for rectangular resonator design according to the present invention.

Please refer to FIG. 8. FIG. 8 shows the comparison results between the NEXT and the FEXT interference in dB in the frequency-domain in GHz by simulation in accordance with preferred design parameters of the rectangular resonator design of the present invention. The curve 130 illustrates the relationship between the FEXT interference in dB and frequency in GHz without any guard traces. The curve 140 illustrates the relationship between the FEXT interference in dB and frequency in GHz with rectangular resonators. The rectangular resonators 17 of the present invention have a significant effect in the ultra-high frequency range of 1 GHz to 6 GHz. In a range of higher frequencies, for example, the range of 7 GHz to 8 GHz, especially, in the range of 7 GHz to 7.8 GHz, the effect is significant. From the above results, the rectangular resonators 17 of the present invention as guard traces indeed have a significantly improving performance on suppressing the FEXT interference.

Please still refer to FIG. 8. The curve 160 illustrates the relationship of the NEXT interference in dB against frequency in GHz without any guard traces. The curve 150 illustrates the relationship of the NEXT interference in dB against frequency in GHz with rectangular resonators. The curves 150, 160 illustrating the suppression resonance on the NEXT interference in dB is varied with the frequencies in GHz no matter whether the guard traces are present. Since the suppression resonance on the NEXT interference, thus in some ranges of frequencies with the rectangular resonators have better performance but at another range, without any guard has a better performance. But as whole, the signal transmission lines without the rectangular resonators in between have a better performance in average, since the curve 160 is at a lower position.

Figure 9:
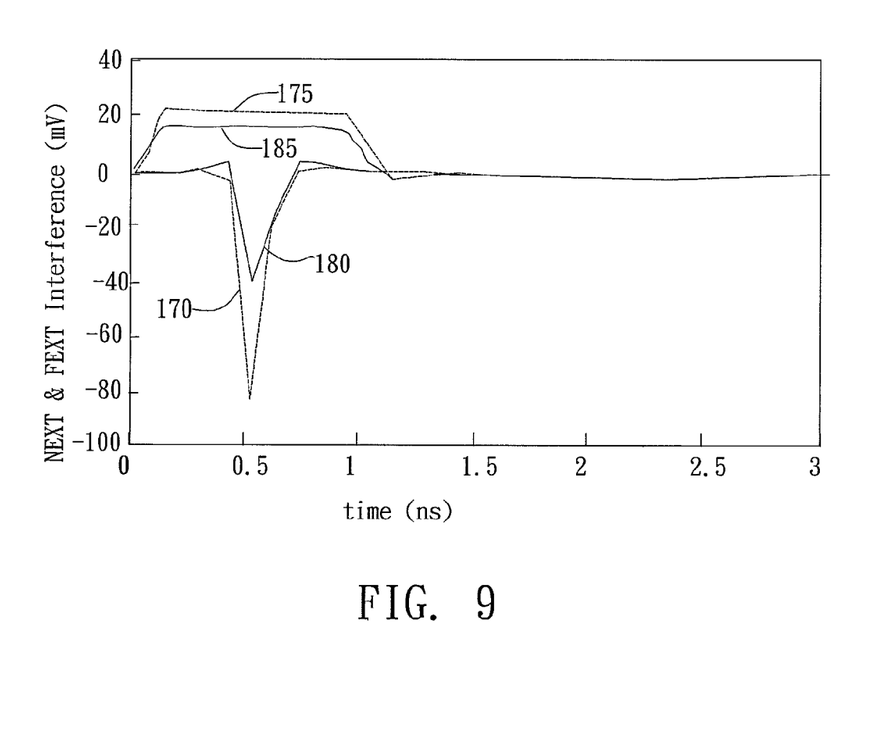
FIG. 9 shows the comparison results between the NEXT and FEXT in the time-domain by simulation in accordance with preferred design parameters for rectangular resonator design according to the present invention.

Next, please refer to FIG. 9. The curve 180 illustrates the relationship of the FEXT interference in mV against the time domain in ns without any guard traces. The curve 170 illustrates the relationship of the FEXT interference in mV against the time domain with rectangular resonators. In FIG. 9, the curves 170, 180 illustrate the suppression on the FEXT interference in mV in the time domain 0.3 ns to 0.9 ns. The performance of the rectangular resonators is significantly better than without any guard traces. Out of the foregoing range in the time domain, the effect is not significant with or without the rectangular resonators. But the performance on the suppression the NEXT, without rectangular resonator showing in curve 185 is better than that of with rectangular resonator showing in curve 175.

Consequently, no matter whether viewing from the time domain or from the comparison of the frequency domain, the rectangular resonator 17 architecture can effectively reduce the influence of interference FEXT although the NEXT interference is slightly increased, but in the parallel terminal interface, the FEXT suppression is more important than that of NEXT. Particularly in the UHF range, most of the signals are digitalized circuit. The FEXT noise occurs at the receiving end, if the FEXT not effectively inhibit more likely to cause the signal misjudgment. For example, for DDR (double data rate) or graphic adapter, the influence of the FEXT interference is more important than that of the NEXT, please refer to "FEXT-eliminated stub-alternated microstrip line for multi-gigabit/second parallel links" ELECTRONICS LETTERS 14 Feb. 2008 Vol. 44 No. 4, by S.-K. Lee, et al."

Figure 10A:
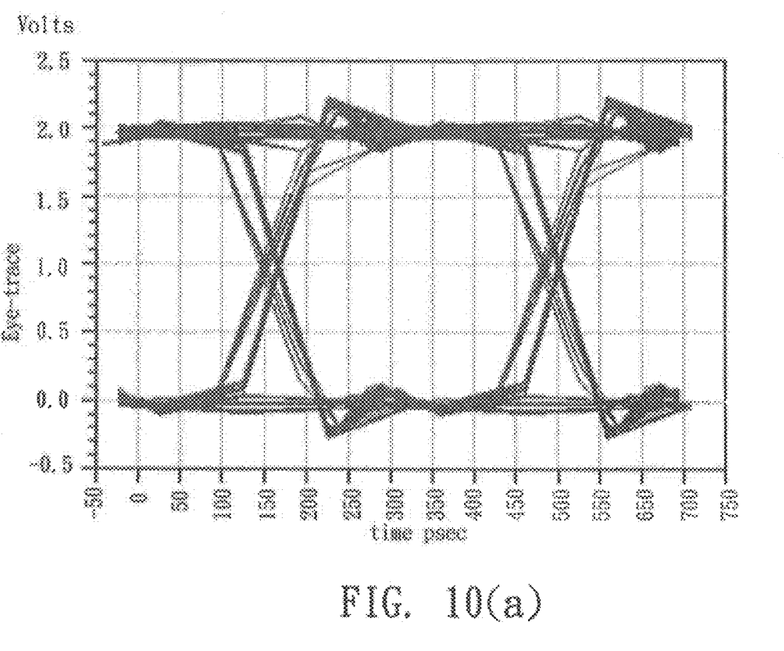
Figure 10B:
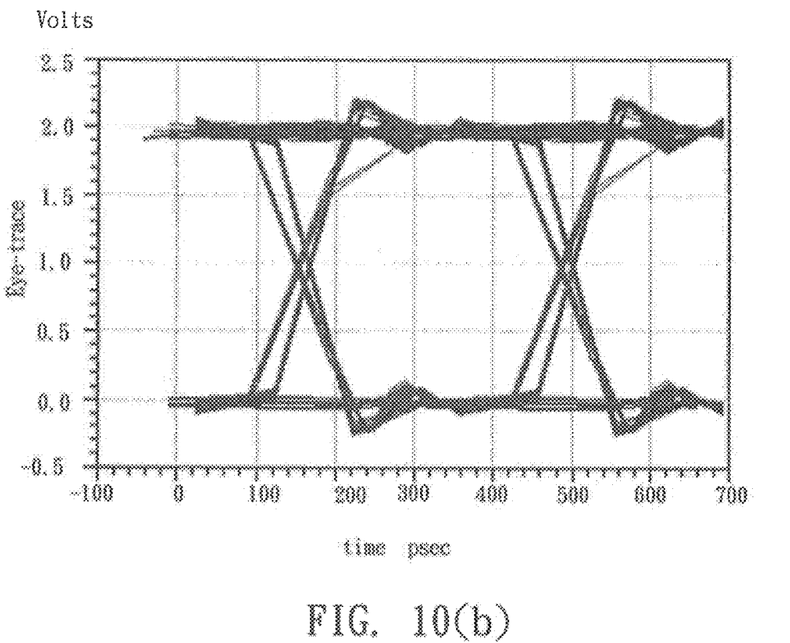

In another aspect, the present invention utilizes the eye diagram by ADS simulation software provided by Agilent Technology to simulate the circuit. To assess the improvement of the rectangular resonator 17 signal timing jitter. Please refer to FIGS. 10 (a) and 10 (b). They show the eye diagrams, respectively for without guard trace and with rectangular resonators 17 as guard trace. The simulation using the parameters as above and the input signal to 4V, the rise time of 100 ps, and the data rate of 3 Gbps.

Viewing from the eye diagrams in FIGS. 10 (a) and 10 (b), the improvement on the amplitude in voltage of eye opening is found; the signal timing jitter part without guard architecture is of 26.04 ps, and with the rectangular resonator 17 architecture is of 20.38 ps. The rectangular resonator architecture improves the signal timing jitter by about 6 ps.

Figure 11A:
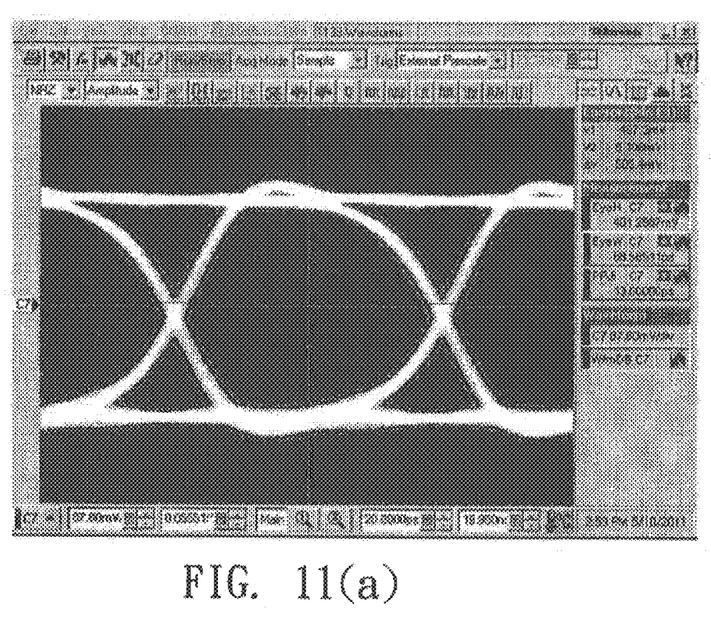
Figure 11B:
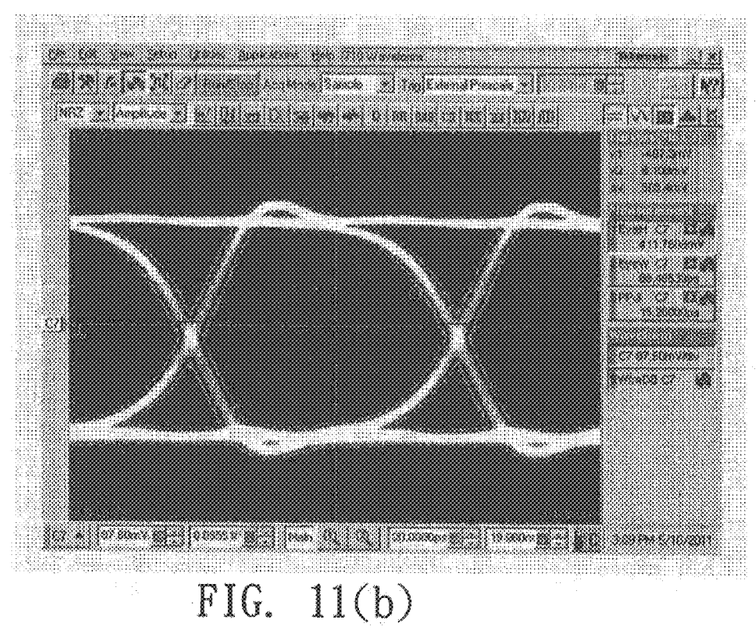

On another aspect, the input signals are $2^{31}-1$ pseudo Random Binary Sequence (PRBS), generated by a signal generator accordingly to the present invention for eye diagram measurement. The input voltage is of 0.5 V and the data rate is of 10 Gbps. The results are shown in FIGS. 11 (a), and 11 (b) and table 1.

TABLE 1

|  | EyeW (ps) | EyeH (mV) | Signal timing jitter (ps) |
|---|---|---|---|
| Without guard traces | 88.46539 | 411.7608 | 15.2 |
| With rectangular resonators | 88.58991 | 401.2587 | 13.6 |

The rectangular resonator architecture substantial suppression of FEXT noise interference without the problem of the resonance; furthermore, it can suppress a lot of FEXT noise amplitude (411.7608 mV vs. 401.2587 mV. Finally, through the observation of the eye diagram, the rectangular resonator architecture can improve the signal timing jitter phenomenon to 13.6 ps from 15.2 ps due to parity modal rate does not match. The improvement up to 10.52%.

The benefits of the present invention are:

(1) Forming the rectangular resonators needs only photolithography and etching techniques, and thus they can be formed simultaneously with the traces of the printed circuit board. Therefore, almost no additional costs on.

(2) The FEXT interference and timing jitter problem can be effectively improved by the rectangular resonators.

(3) Compared to the prior art which needs the guard elements such as the resistor or shorting-via, the present invention provides only simple traces on the board. The resistors may impede the circuit elastic layout and the shorting-vias may need an extra cost. The disadvantages of both are getting improvement in according to the present invention. As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. Guard traces for preventing two parallel signal transmission lines from far-end crosstalk (FEXT) and timing jitter, consisting essentially of:
   a plurality of rectangular resonators spaced from each other formed in between the two parallel signal transmission lines and each resonator having long sides thereof perpendicular to a signal transmission direction of the two parallel signal transmission lines.

2. The guard traces according to claim 1 wherein said plurality of rectangular resonators are equidistantly spaced along said signal transmission direction.

3. The guard traces according to claim 1 wherein said plurality of resonators each has short sides thereof spaced from the two signal transmission lines by a pitch between about 0.5 mm to 1.5 mm to enhance a capacitive coupling ratio therebetween.

4. The guard traces according to claim 1 wherein said plurality of rectangular resonators are spaced at intervals of about one-third to one half of the long side of the plurality of rectangular resonators.

5. The guard traces according to claim 1 wherein each of said rectangular resonators has a width between about 0.5 mm to 1.5 mm.

6. The guard traces according to claim 1 wherein each of said rectangular resonators has a width about 1 mm.

7. Guard traces for preventing two parallel signal transmission lines from far-end crosstalk (FEXT) and timing jitter, comprising:
   a plurality of rectangular resonators, isolated and spaced from each other formed in between the two parallel signal transmission lines and each resonator having long sides thereof perpendicular to a signal transmission direction of the two parallel signal transmission lines, said plurality of rectangular resonators without forming any shorting-via or any resistor installation.

8. The guard traces according to claim 1 wherein said plurality of rectangular resonators are spaced at intervals of about one-third to one half of the long side of the plurality of rectangular resonators.

* * * * *